United States Patent (10) Patent No.: US 10,074,439 B2
Li et al. (45) Date of Patent: Sep. 11, 2018

(54) MODELING METHOD OF THRESHOLD VOLTAGE DISTRIBUTIONS

(71) Applicant: SK hynix Inc., Gyeonggi-do (KR)

(72) Inventors: Haibo Li, Sunnyvale, CA (US); Shi Yin, Sunnyvale, CA (US); Lingqi Zeng, San Jose, CA (US); Yu Cai, San Jose, CA (US); Fan Zhang, Fremont, CA (US); June Lee, Sunnyvale, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/174,667

(22) Filed: Jun. 6, 2016

(65) Prior Publication Data

US 2016/0358663 A1 Dec. 8, 2016

Related U.S. Application Data

(60) Provisional application No. 62/171,180, filed on Jun. 4, 2015, provisional application No. 62/321,565, filed on Apr. 12, 2016.

(51) Int. Cl.
*G11C 16/04* (2006.01)
*G11C 16/34* (2006.01)
*G11C 7/02* (2006.01)
*G11C 11/56* (2006.01)
*G11C 16/10* (2006.01)
*G11C 29/04* (2006.01)

(52) U.S. Cl.
CPC ............ *G11C 16/3431* (2013.01); *G11C 7/02* (2013.01); *G11C 11/5628* (2013.01); *G11C 16/10* (2013.01); *G11C 16/3427* (2013.01); *G11C 16/3436* (2013.01); *G11C 16/0483* (2013.01); *G11C 2029/0411* (2013.01)

(58) Field of Classification Search
USPC ............ 365/185.02, 185.03, 185.19, 185.22
See application file for complete search history.

(56) References Cited

U.S. PATENT DOCUMENTS 7,889,566 B2 * 2/2011 Kang .................. G11C 11/5628
365/185.03
8,208,310 B2 * 6/2012 Dong .................. G11C 11/5642
365/185.22
8,595,597 B2 11/2013 Xie et al.
(Continued)

FOREIGN PATENT DOCUMENTS

KR 1020160004073 1/2016

OTHER PUBLICATIONS

Yu Cai et al., Threshold Voltage Distribution in MLC NAND Flash Memory: Characterization, Analysis, and Modeling,Proceedings of the Conferece on Design, Automation and Test in Europe, 2013, 1-6, IEEE.

(Continued)

*Primary Examiner* — Connie Yoha
(74) *Attorney, Agent, or Firm* — IP & T Group LLP (57) ABSTRACT

Memory systems may include a memory including a plurality of wordlines, each wordline including a plurality of cells, and a controller suitable for obtaining an initial voltage threshold and a target state for each of the plurality of cells, applying a pulse based on a pulse value to the plurality of cells, and calculating at least one coupling effect to neighboring cells.

14 Claims, 12 Drawing Sheets

(56) References Cited

U.S. PATENT DOCUMENTS

| | | | | |
|---|---|---|---|---|
| 8,811,091 B2* | 8/2014 | Li | ............... | G11C 11/5628 |
| | | | | 365/185.03 |
| 9,406,393 B2* | 8/2016 | Park | ............... | G11C 16/3459 |
| 2006/0285392 A1* | 12/2006 | Incarnati | ............... | G11C 16/3404 |
| | | | | 365/185.22 |
| 2009/0059671 A1* | 3/2009 | Park | ............... | G11C 16/0483 |
| | | | | 365/185.19 |
| 2009/0303788 A1* | 12/2009 | Roohparvar | ............... | G11C 11/5628 |
| | | | | 365/185.02 |
| 2010/0027337 A1* | 2/2010 | Park | ............... | G11O 5/147 |
| | | | | 365/185.11 |
| 2013/0039130 A1* | 2/2013 | Lee | ............... | G11C 11/5628 |
| | | | | 365/185.19 |
| 2014/0198567 A1* | 7/2014 | Mokhlesi | ............... | G11C 11/5642 |
| | | | | 365/185.03 |
| 2015/0155046 A1* | 6/2015 | Lee | ............... | G11C 16/10 |
| | | | | 365/185.12 |
| 2016/0005480 A1 | 1/2016 | Kim et al. | | |
| 2016/0078945 A1* | 3/2016 | Kim | ............... | G11C 16/10 |
| | | | | 365/185.12 |

OTHER PUBLICATIONS

T. Parnell et al, Modelling of the Threshold Voltage Distributions of Sub-20nm NAND Flash Memory, NVMW 2015, UCSD, Mar. 2015, p. 1-13, Zurich, Switzerland.

* cited by examiner

MODELING METHOD OF THRESHOLD VOLTAGE DISTRIBUTIONS

CROSS-REFERENCE TO RELATED APPLICATIONS

This application claims the benefit of U.S. Provisional Application No. 62/171,180 filed Jun. 4, 2015 and U.S. Provisional Application No. 62/321,565 filed Apr. 12, 2016, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

As the scaling process for flash memory devices proceeds, reliability, in both endurance and retention, degrades. Thus, there is a need for improved error correction and modeling in flash memory devices.

SUMMARY

Aspects of the invention include memory systems. The memory systems may include a memory including a plurality of wordlines, each wordline including a plurality of cells, and a controller suitable for obtaining an initial voltage threshold and a target state for each of the plurality of cells, applying a pulse based on a pulse value to the plurality of cells, and calculating at least one coupling effect to neighboring cells.

Further aspects of the invention include methods. The methods may include obtaining, with a controller, an initial voltage threshold and a target state for each of a plurality of cells of a wordline, applying, with the controller, a pulse based on a pulse value to the plurality of cells, and calculating, with the controller, at least one coupling effect to neighboring cells.

Additional aspects of the invention include memory devices. The memory devices may include a memory including a plurality of wordlines, each wordline including a plurality of cells, and a controller configured to obtain an initial voltage threshold and a target state for each of the plurality of cells, apply a pulse based on a pulse value to the plurality of cells, and calculate at least one coupling effect to neighboring cells after applying the pulse.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
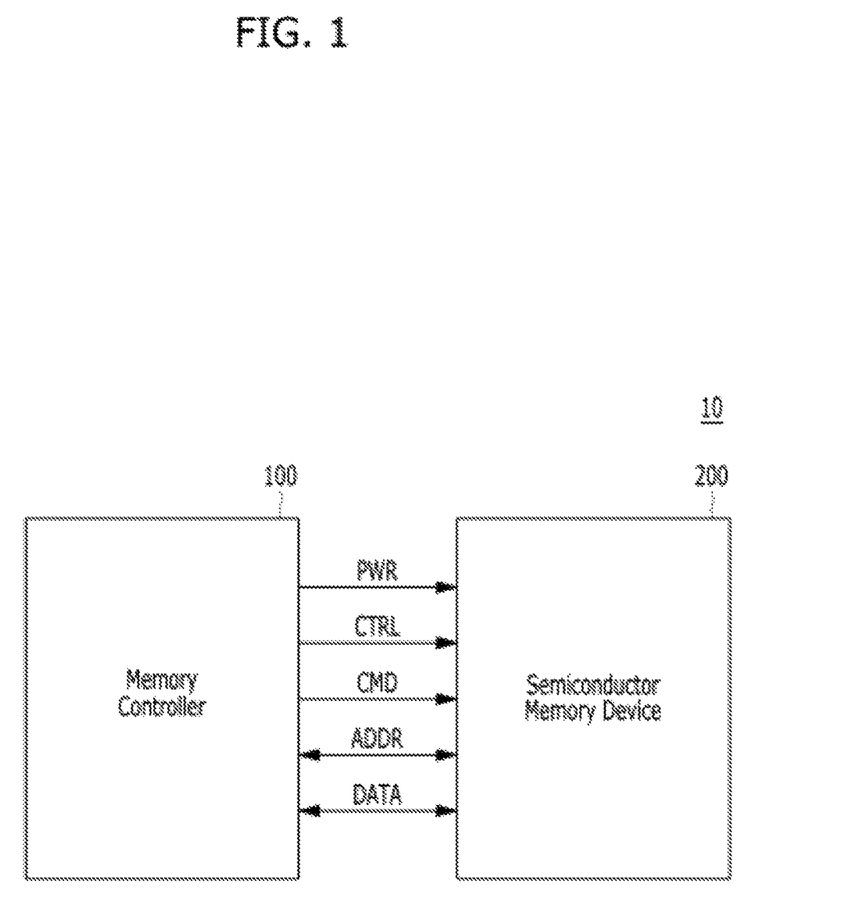
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
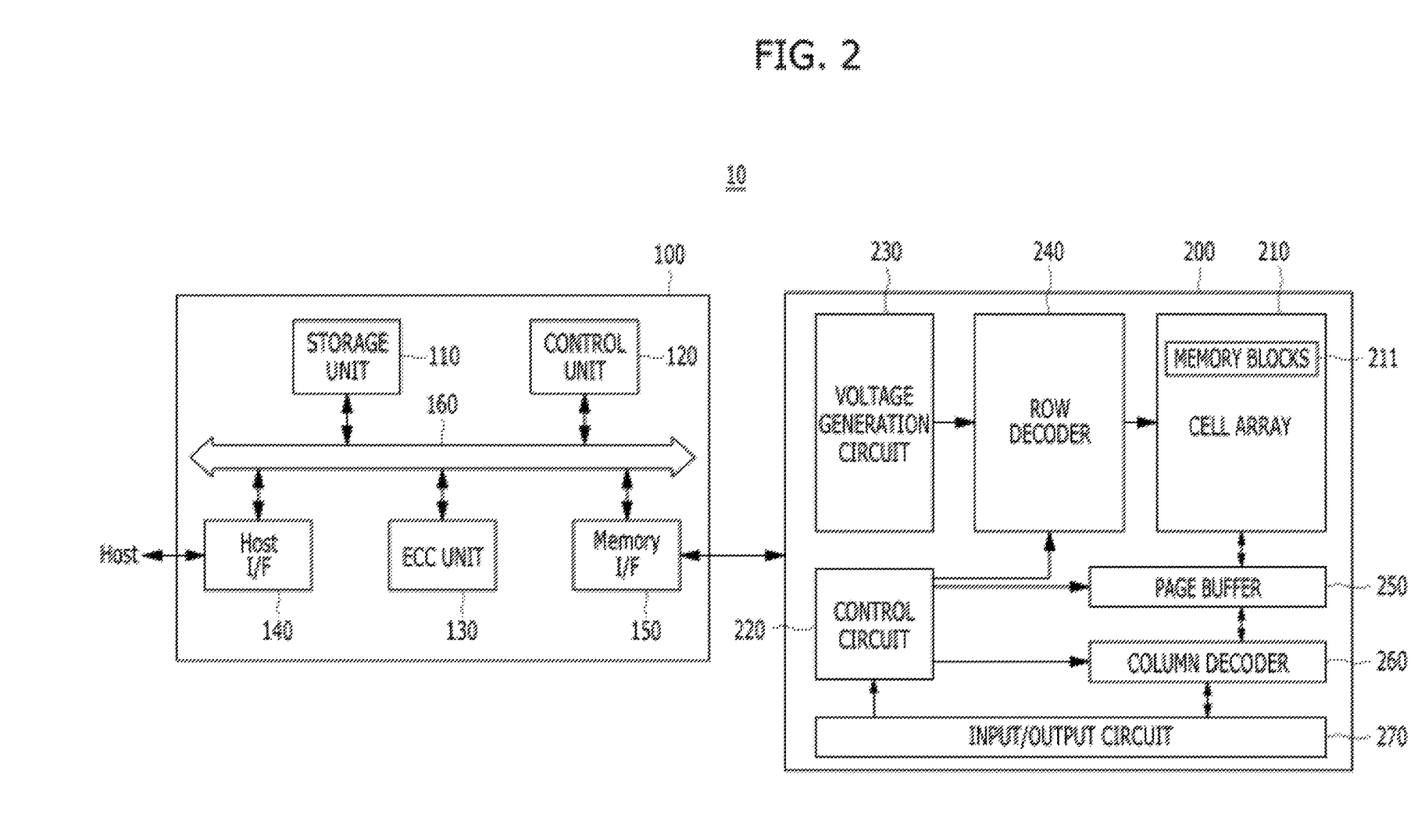
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
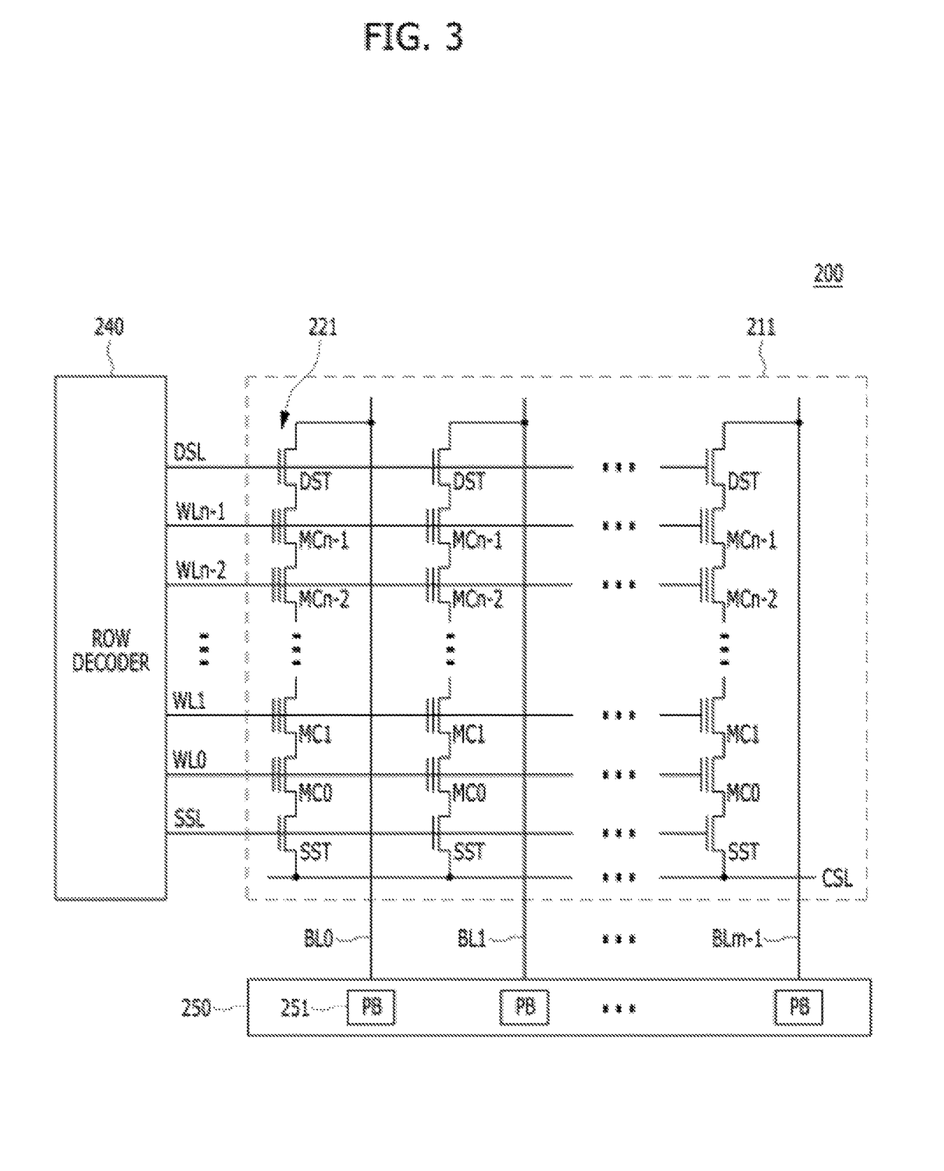
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Over the last decade, NAND flash memory has been the prevailing choice for applications of most mobile device storage and solid-state drives (SSD). However, with the scaling of process technology and introduction of 2 bits/cell (Multi level cell or "MLC") and 3 bits/cell (Triple level cell or "TLC") technology, NAND flash reliability (both endurance and retention) degrades. Higher error rates are introduced by the various devices and circuit level noises and a reduced Vt (voltage threshold) window margin is demonstrated. The requirement of stronger error correction codes (ECC), such as BCH and low-density parity check ("LDPC") codes, have become the key component of SSD controller design. The development of more powerful ECC mechanisms requires characterization and measurement of real data from large quantities of NAND flash memory devices, which can take long time and huge resources. Modeling of real-like Vt distributions in NAND flash memory can make the ECC codes development more effective and efficient.

Some previous modeling work assumed particular threshold voltage distributions following closed form probability distribution functions, or the parametric functions with additive white Gaussian noise (AWGN). These models do not accurately represent the Vt distribution in the crossover regions which are the key targets for ECC simulations. As disclosed herein, a novel method to generate real-like Vt distributions by mimicking the NAND operations and treat them as random processes for each cell is described. Although the devices, processes, methods, and systems described herein are referred to with reference to NAND flash memory, it will be understood by those of skill in the art that they can be implement on other suitable memories in order to effectuate the invention disclosed herein.

Normal NAND operations include erase, program, and read. After the NAND cells are programmed, charges will start to leak out of or into a cell depending on the cell's threshold voltage. All of these processes happen randomly for a particular cell and can be treated as "noises" applied to the cell. These "noises" may follow a specific distribution, which most times cannot be described using an analytical probability distribution function. In accordance with aspects of the invention disclosed herein, the "noise" distributions are measured at some specific P/E (program/erase) counts and data retention (DR) time points, and these values are obtained at any given P/E count and DR time by interpolation or extrapolation from the measured data. The "noises" are then the inverse functions of the cumulative density functions (CDF) of the measured probability density functions (PDF).

Figure 4:
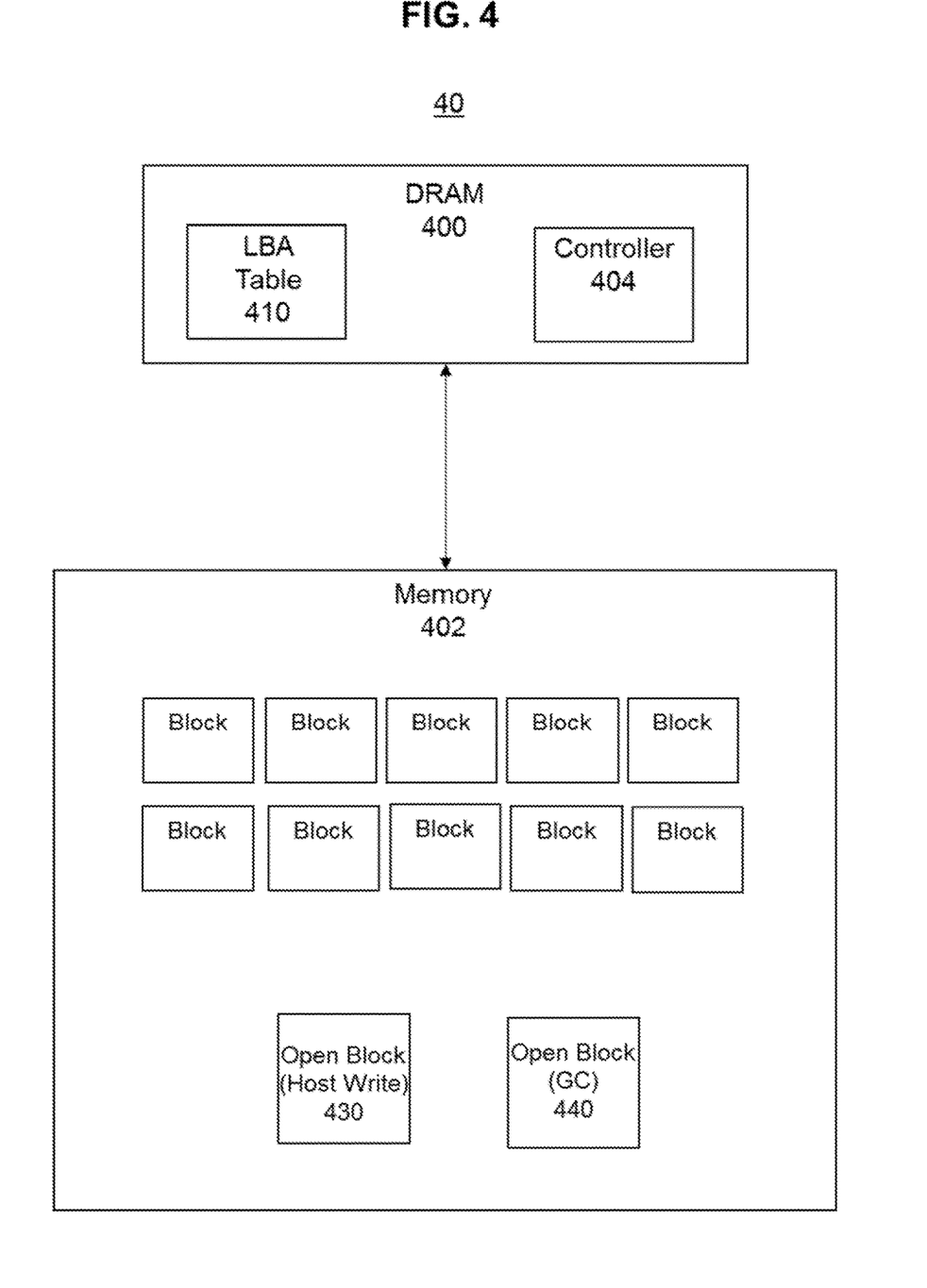
FIG. 4 is a diagram of a memory system according to aspects of the invention.

Referring to FIG. 4, a diagram of a memory system 40 is shown. The memory system 40 may include a DRAM portion 400 and a memory portion 402 (e.g., a NAND memory). The DRAM 400 may include a logical block address (LBA) table 410 and a controller 404, such as the controllers described above. The LBA table 410 may alternatively or additionally be stored on the memory 402. The memory 402 may include a plurality of memory blocks, an open block for host writes 430, and an open block for garbage collection (GC) 440. The system 40 will be understood to be a basic overview of an example memory system and those of skill in the art will understand alternative structures that may be implemented in order to effectuate the invention disclosed herein.

Figure 5:
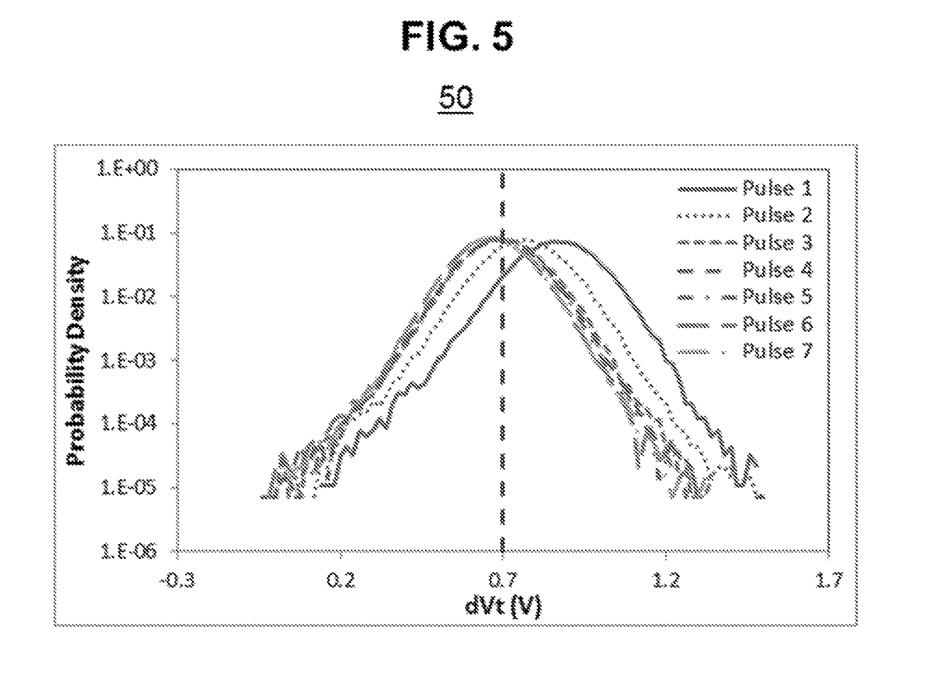
FIGS. 5, 6, 7, and 8 are graphs depicting various measured values in accordance with aspects of the invention.
Figure 6:
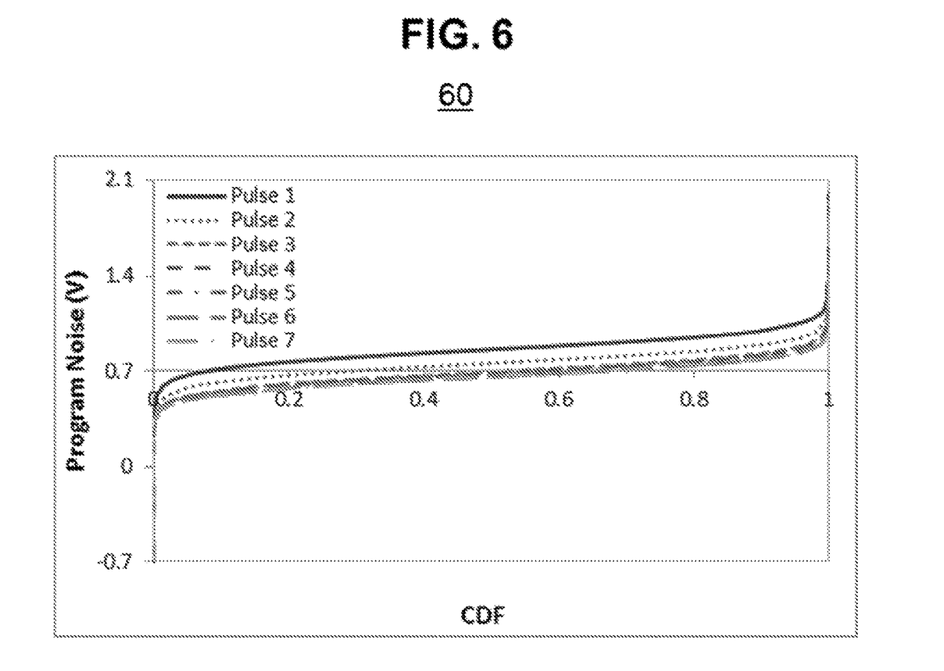

Referring next to FIGS. 5 and 6, a graph 50 depicting measured program noises and a graph 60 depicting corresponding program noise vs. CDF plots are shown. Average Vt of all cells increases with the incremental program voltage pulses. However, a particular cell's Vt increase does not always follow the program voltage. Instead it may be a random variable around the program step size. Program noise is characterized as the cells' Vt differences when a wordline is programmed pulse-by-pulse without verify operations. The graph 50 of FIG. 5 shows the obtained program noise on the measured 16 nm NAND flash device fresh block when the program step size is 0.7V. For the initial few pulses, the Vt shift is larger because cells are further from the Fowler-Nordheim tunneling equilibrium. As shown, when the program is at steady state (from pulse #3), the peak of the probability density distribution is slightly lower than the step size. In the modeling, the program noise distribution for any given P/E cycle is linearly extrapolated from the measured data points as:

$$p=p1+(p2-p1)\times(PE-PE1)/(PE2-PE1)$$

Where P1, P2 are the program noise distributions at P/E count PE1, PE2, respectively.

Figure 7:
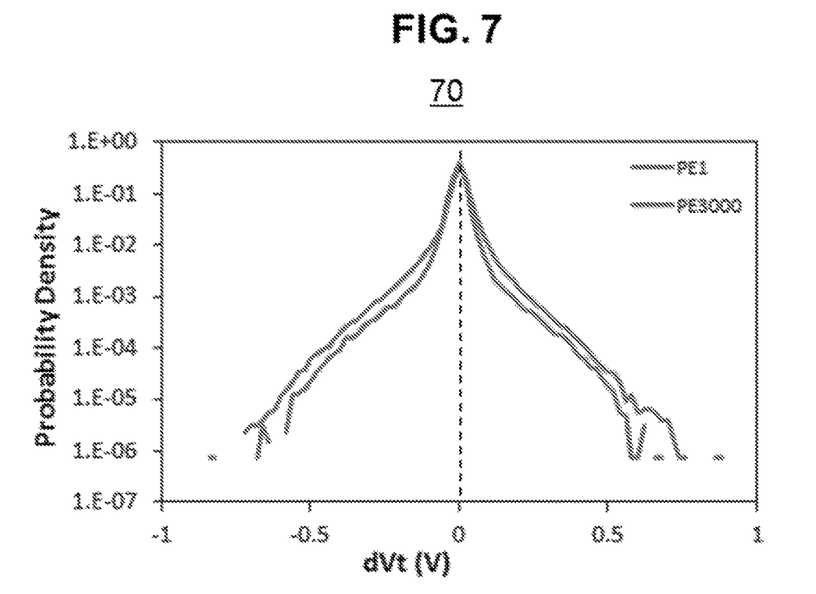

Referring next to FIG. 7, a graph 70 depicting read noise is to shown. Program verify and read are essentially the same operation in NAND flash devices. A cell's Vt may be different even if read consecutively because of the read current fluctuation. Read noise is characterized as the Vt variation between two consecutive reads as shown in FIG. 7. As shown, the peak of the probability density distribution is at 0V and the distribution becomes slightly wider as the NAND flash cycles. In the modeling, the read noise for any given P/E cycle is linearly extrapolated from the measured data points as:

$$R=R1+(R2-R1)\times(PE-PE1)/(PE2-PE1)$$

Where R1, R2 are the read noise distributions at P/E count PE1, PE2, respectively.

Figure 8:
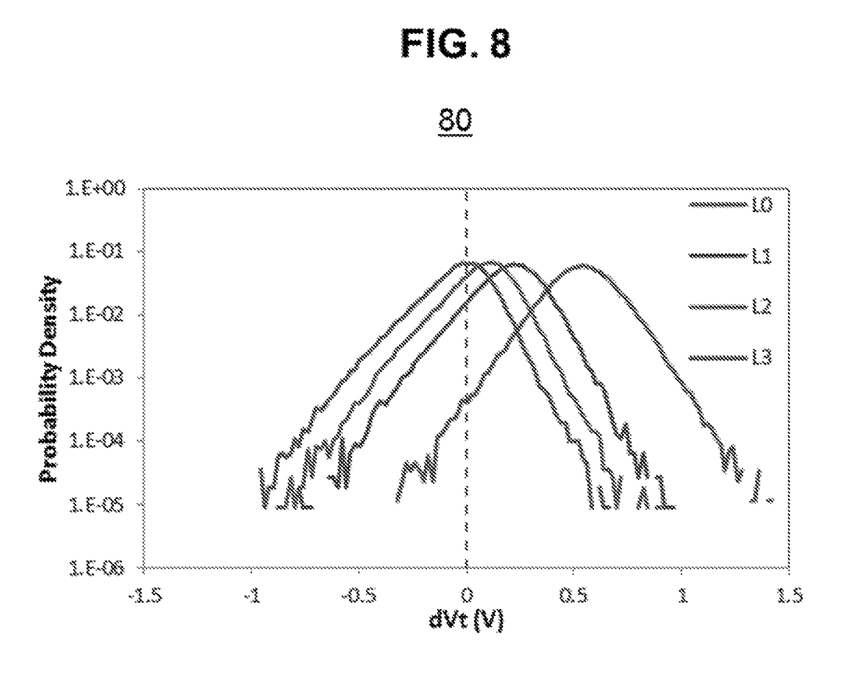

In FIG. 8, a graph 80 depicting data retention (DR) noise is shown. After a NAND cell is programmed, the stored charges in the floating gate or trapped in the tunnel oxide may be lost gradually with time, especially at elevated temperatures. The cells in deep erase state may also gain electrons during this process. With P/E cycling, the tunnel oxide accumulates damages and becomes more conductive, making this process even faster. As disclosed herein, the Vt shift of each cell during data retention is treated as a random "noise", following a specific distribution depending on the cell's state. In the characterization, the NAND flash blocks are first cycled to the target P/E numbers at room temperature with a dwell time about 20s between each cycle, then baked at 100° C. for the target equivalent times up to 1 year at 40° C. assuming an activation energy of 1.1 eV. As an example, FIG. 8 shows the Vt shift probability density distributions of 3 k P/E cycled block after bake for 1 year at 40° C. As shown, the distributions are not symmetric, with the higher levels skew to the left (lose electrons, Vt downshift) and the erase level shift to the right (gain electrons, Vt up-shift).

It is well-known that the Vt shift during data retention is proportional to logarithm of time. In the modeling the DR noise for a given P/E cycle and any bake time t is obtained by logarithmic-linear extrapolation regarding to bake time as:

$$p=p1+(p2-p1)\times(ln(t)-ln(t1))/(ln(t2)-ln(t1))$$

Where P1, P2 are the DR noise distributions at DR time t1 and t2, respectively.

Additional parameters may be obtained from particular characterizations. Capacitive coupling interference effects are considered for each cell to its neighboring cells on the same programming word line (BL-to-BL coupling), and on the neighboring word lines (WL-to-WL coupling and diagonal-to-diagonal coupling). BL-to-BL coupling is calculated for each inhibited cell on the programming word line as the neighboring cell Vt increase multiplied by the coupling coefficient. WL-to-WL coupling and diagonal-to-diagonal coupling are calculated for all the neighboring cells on the neighboring word lines as the cell (on the programming WL) Vt increase multiplied by the corresponding coupling coefficient. Secondary (and higher order) coupling effect is ignored. These three types of coupling interference coefficients are characterized and obtained individually.

Figure 9:
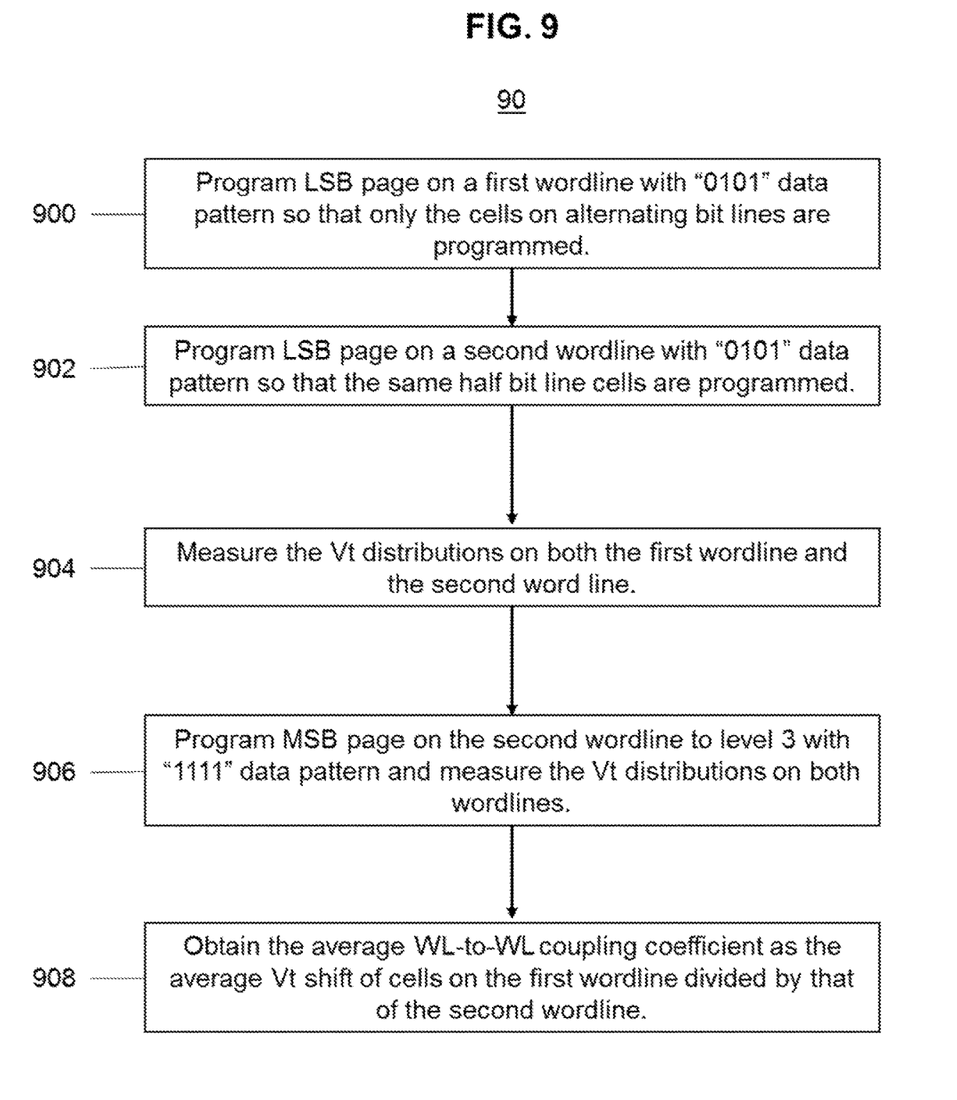
FIG. 9 is a flowchart of steps for determining capacitive coupling coefficients according to aspects of the invention.

FIG. 9 is a flowchart 90 of steps for obtaining a capacitive coupling coefficient. The capacitive coupling coefficient may be defined by the victim cells' Vt shift divided by the attacker cells' Vt shift.

At step 900, a least significant bit (LSB) page on a first wordline is programmed with a "0101" data pattern so that only the cells on alternating bit lines are programmed. At step 902, the LSB page on a second wordline is programmed with a "0101" data pattern so that the same half bit line cells are programmed. At step 904, the Vt distributions on both the first wordline and the second wordline are measured. At step 906, the most significant bit (MSB) page on the second wordline is programmed to level 3 with a "1111" data pattern and the Vt distributions on both the first wordline and the second wordline are measured. At step 908, the average WL-to-WL coupling coefficient is obtained. The average WL-to-WL coupling coefficient may be defined as the average Vt shift of cells on the first wordline divided by that of the second wordline.

Figure 10:
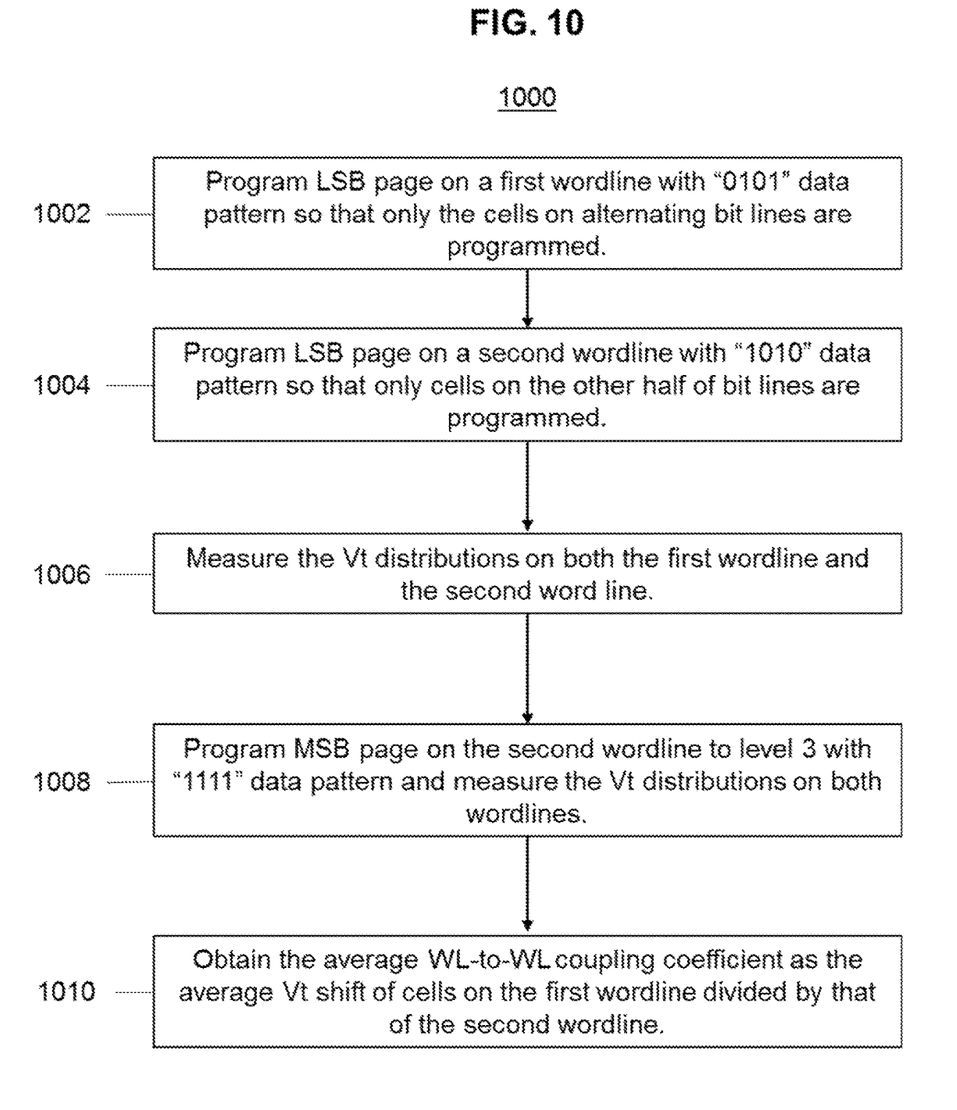
FIG. 10 is a flowchart of steps for determining diagonal-to-diagonal coupling effects according to aspects of the invention.

Referring next to FIG. 10, a flowchart 1000 of steps for obtaining the diagonal-to-diagonal coupling effect are shown. The diagonal-to-diagonal coupling effect may be obtained similarly to the capacitive coupling coefficient described at FIG. 9.

At step 1002, a least significant bit (LSB) page on a first wordline is programmed with a "0101" data pattern so that only the cells on alternating bit lines are programmed. At step 1004, the LSB page on a second wordline is programmed with a "1010" data pattern so that only cells on the other half of bit lines are programmed. At step 1006, the Vt distributions on both the first wordline and the second wordline are measured. At step 1008, the most significant bit (MSB) page on the second wordline is programmed to level 3 with a "1111" data pattern and the Vt distributions on both the first wordline and the second wordline are measured. At step 1010, the average WL-to-WL coupling coefficient is obtained. The average WL-to-WL coupling coefficient may be defined as the average Vt shift of cells on the first wordline divided by that of the second wordline.

Figure 11:
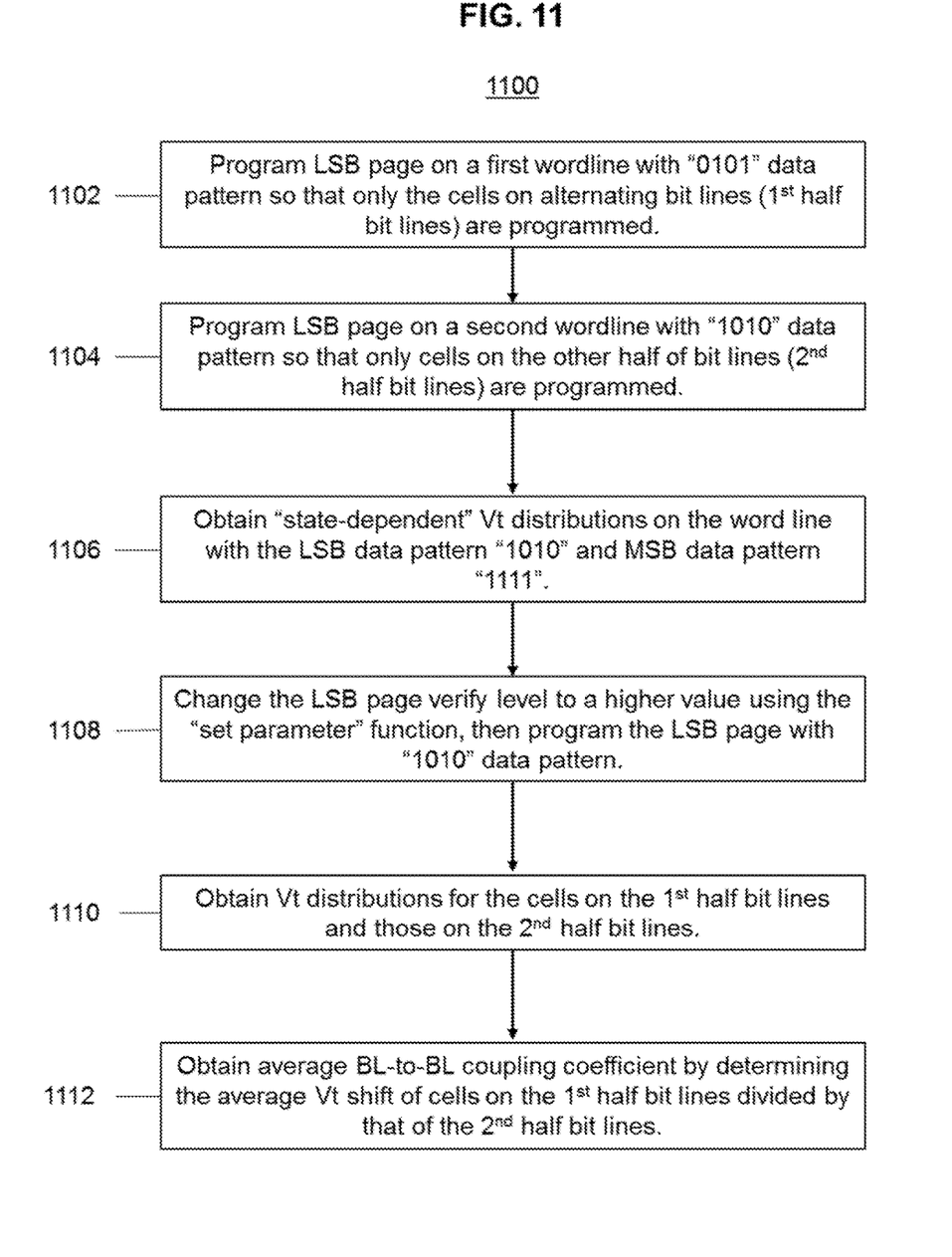
FIG. 11 is a flowchart of steps for determining BL-to-BL coupling effects in accordance with aspects of the invention.

At FIG. 11, a flowchart 1100 of steps for obtaining the BL-to-BL coupling effect characterization is shown. The BL-to-BL coupling effect characterization may be possible through a "set parameter" function to change the NAND internal register value for the program verify level.

At step 1102, the LSB on a first wordline is programmed with a "0101" data pattern so that only cells on alternating bit lines (1 half bit lines) are programmed. At step 1104, the LSB page on a second wordline is programmed with a "1010" data pattern so that only cells on the other half of bit lines ($2^{nd}$ half bit lines) are programmed. At step 1106, "state-dependent" Vt distributions on the wordline with the LSB data pattern "1010" and MSB data pattern "1111" are obtained. In this way, cells on the $1^{st}$ half of bit lines are read as in "11" state (level 0) and cells on the $2^{nd}$ half of bit lines are read as in "01" state (level 3), so that they belong to two separate distributions.

At step 1108, the LSB verify level is changed to a higher value using the "set parameter" function, and then the LSB page is programmed with a "1010" data pattern. At step 1110, the Vt distributions are obtained for the cells on the $1^{st}$ half bit lines and the cells on the $2^{nd}$ half bit lines. At step 1112, the average BL-to-BL coupling coefficient is obtained. The average BL-to-BL coupling coefficient may be obtained by determining the average Vt shift of cells on the $1^{st}$ half bit lines divided by the average Vt shift of cells on the $2^{nd}$ half bit lines.

Figure 12:
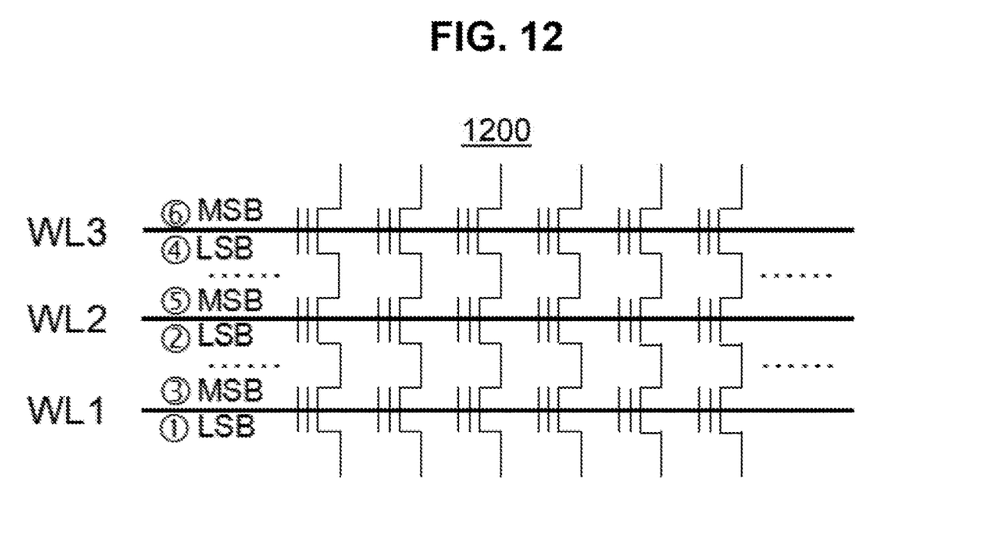
FIG. 12 is an example diagram of a memory system according to aspects of the invention.

As an example to describe the threshold voltage distribution modeling technique disclosed herein, cells on 3 consecutive wordlines are used as shown in the diagram 1200 of FIG. 12 in order to emulate a normal condition for a typical Vt distribution on any wordline in a NAND block. The center wordline (WL2) represents middle wordlines, WL1 represents the first wordline on the source side, and WL3 represents the last wordline on the drain side in an MLC NAND block.

Each word line contains two logical pages: LSB (least significant bit) page and MSB (most significant bit) page. The state level 0 to 3 (level 0 the erase state, and level 3 the highest program state) in the NAND flash device are coded as "11", "01", "00", and "10", respectively, with low digit being the LSB and high digit being the MSB. The numbers of logical pages in the figure show the page program sequence following the typical ABL (all bit lines) NAND program method in order to reduce the capacitive coupling interference between neighboring cells.

Figure 13:
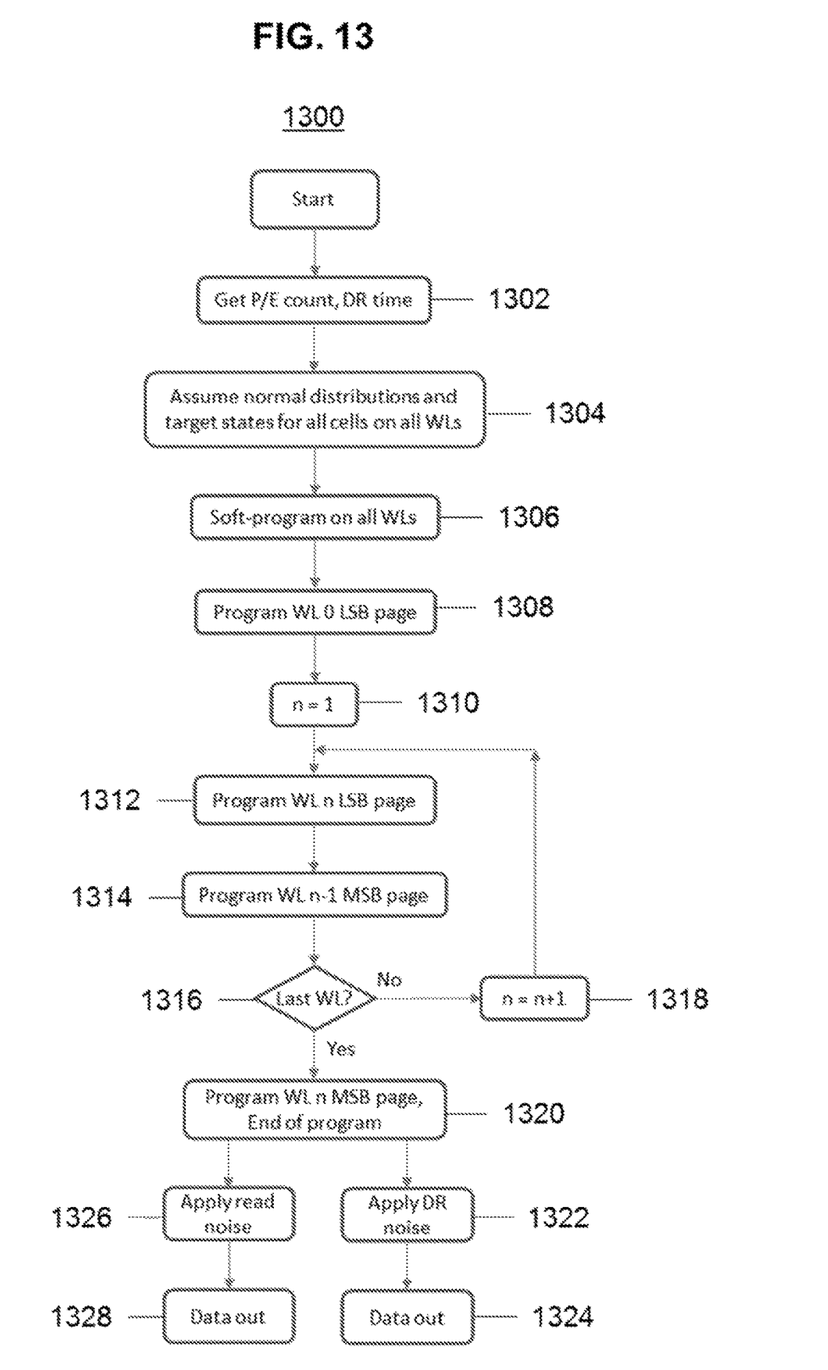
FIG. 13 is an algorithm for steps in a method in accordance with aspects of the invention.

Referring next to FIG. 13, a modeling top algorithm 1300 is shown. At 1302, P/E count and DR time are obtained. At 1304, normal distributions and target states for all cells on all wordlines is assumed (e.g., initial setting). At 1306, all wordlines may be soft-programmed. At 1308, the 0 wordline LSB page may be programmed. At 1310, a wordline value (e.g., n) is set to 1. At 1312, the LSB page of the wordline at the wordline value may be programmed. At 1314, the MSB of the wordline at the wordline value minus 1 (e.g., n−1) may be programmed. At 1316, it is determined if the cycle has reached the last wordline in the block. If not, the wordline value is incremented by 1 at 1318 (e.g., n=n+1). If so, the MSB of the wordline at the wordline value may be programmed and programming may be stopped at 1320. At 1322, the DR noise is applied and data is read out at 1324. At 1326, read noise is applied and data is read out at 1328.

Figure 14:
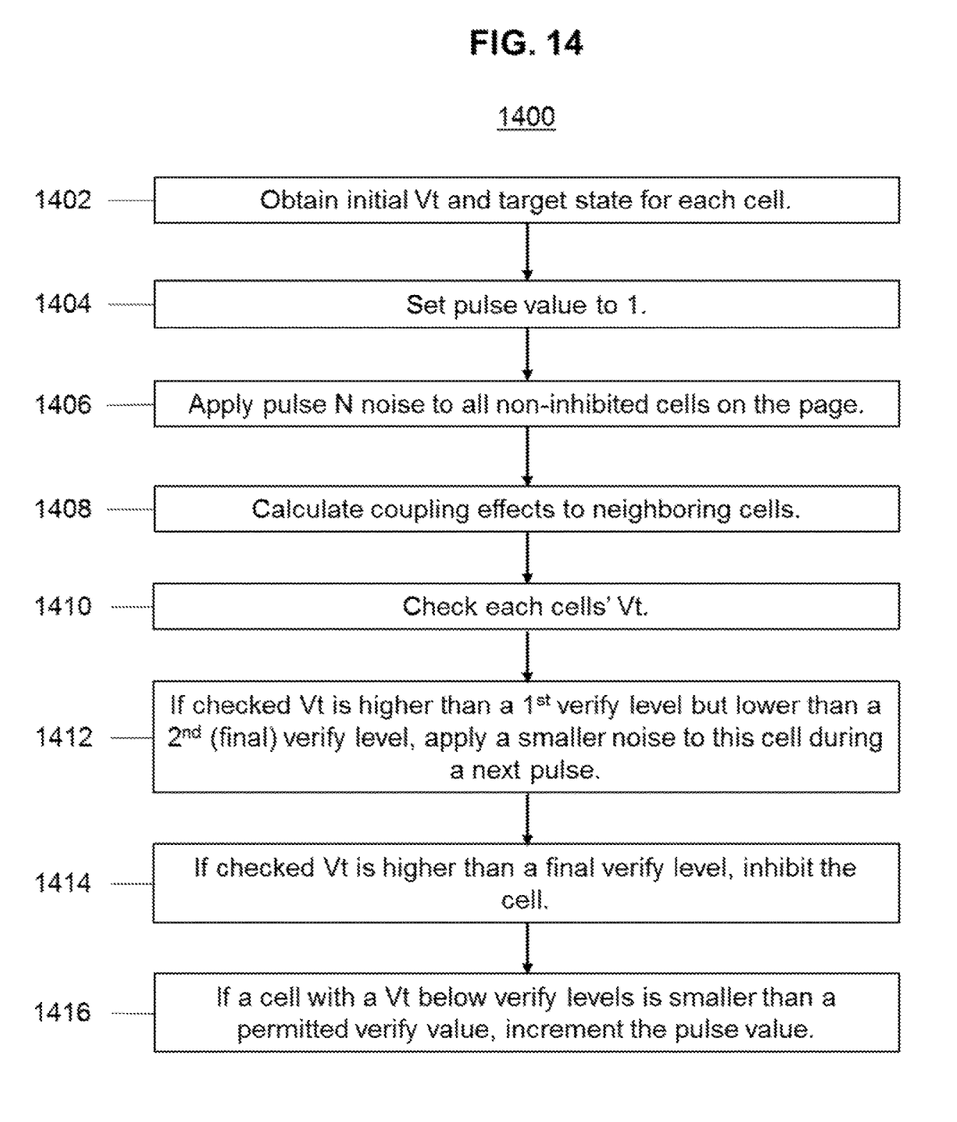
FIG. 14 is a flowchart of steps for determining voltage threshold distributions according to aspects of the invention.

At FIG. 14, a flowchart 1400 of steps for a modeling flow of a page program (LSB or MSB page) is shown. The flowchart 1400 shows an example of how to obtain values for determining the threshold modeling (e.g., capacitive coupling coefficients, diagonal-to-diagonal coupling effect, BL-to-BL coupling effect, etc.). Although the term cell is used as an example, "cell" may refer to blocks, wordlines, or other portions of a memory as will be understood to those of skill in the art from the description herein.

At step 1402, an initial Vt and target state is obtained for each cell. At step 1404, a pulse value (e.g., an integer) is set to an initial value, such as 1 (although 0 may be utilized as well in some embodiments). The pulse value may be designated as N. At step 1406, a pulse with value based on N is applied to all non-inhibited cells on the page. At step 1408, coupling effects to neighboring cells are calculated. The coupling effects may include the capacitive coupling coefficients, diagonal-to-diagonal coupling effects, BL-to-BL coupling effects, etc. At step 1410, the Vt of each cell is checked. At step 1412, if the checked Vt is higher than a first verify level but lower than a second (final) verify level, a smaller noise (e.g., pulse with value less than N) to the cell during a next pulse (e.g., in embodiments where a 2-step verify scheme is used). At step 1414, if the checked Vt is higher than a final verify level, the cell may be inhibited. At step 1416, if a cell with a Vt below verify levels (e.g., below $1^{st}$ or $2^{nd}$ verify levels) is smaller than a permitted verify value, the pulse value is incremented (e.g., increased by 1 or other values). The permitted verify value may be a predetermined state level (e.g., 11, 01, 00, 10) as described above.

The verify levels may function as a range and/or a threshold. For example, the first verify level may function as a lower limit and/or a permitted verify value and the second verify level may function as a higher limit and/or final verify level. Thus, if a checked voltage threshold is lower than the first verify level (e.g., lower than the first limit or lower than the permitted verify level), the pulse value may be incremented. If the checked voltage threshold is between the first verify level and the second verify level, a smaller noise pulse may be applied to the cell/wordline. If the checked voltage threshold is higher than the second/final verify level, the cell/wordline may be inhibited.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
a memory including a plurality of wordlines, each wordline including a plurality of cells; and
a controller is configured to:
obtain an initial voltage threshold and a target state for each of the plurality of cells;
apply a pulse having a pulse value to each of the plurality of cells;
check a voltage threshold of each of the plurality of cells after applying the pulse in accordance with a permitted verify level and a final verify level, wherein the permitted verify level is less than the final verify level;
adjust the pulse value of a next pulse to be applied to a select cell of the plurality of cells in accordance with the checked voltage threshold, wherein the pulse value of the next pulse is incremented when the checked voltage threshold of the select cell is less than the permitted verify level, and the pulse value of the next pulse is decremented when the checked voltage threshold of the select cell is greater than the permitted verify level and less than the final verify level; and
calculate at least one coupling effect to neighboring cells.

2. The memory system of claim 1, wherein the controller is further configured to inhibit a cell when the checked voltage threshold is higher than the final verify level.

3. The memory system of claim 1, wherein the at least one coupling effect includes a capacitive coupling coefficient, a diagonal-to-diagonal coupling effect, or a BL-to-BL coupling effect.

4. The memory system of claim 3, wherein the capacitive coupling coefficient is obtained as an average voltage threshold shift of cells on a first wordline divided by an average voltage threshold shift on a second wordline.

5. The memory system of claim 3, wherein the BL-to-BL coupling effect is obtained as an average voltage threshold shift of cells on a first half of bit lines divided by an average voltage threshold shift on a second half of bit lines.

6. A method, comprising:
obtaining, with a controller, an initial voltage threshold and a target state for each of a plurality of cells of a wordline;
applying, with the controller, a pulse having a pulse value to each of the plurality of cells;
checking a voltage threshold of each of the plurality of cells after the pulse is applied in accordance with a permitted verify level and a final verify level, wherein the permitted verify level is less than the final verify level;
adjusting the pulse value of a next pulse to be applied to a select cell of the plurality of cells in accordance with the checked voltage threshold, wherein adjusting comprises incrementing the pulse value of the next pulse when the checked voltage threshold of the select cell is less than the permitted verify level, and decrementing the pulse value of the next pulse when the checked voltage threshold of the select cell is greater than the permitted verify level and less than the final verify level; and
calculating, with the controller, at least one coupling effect to neighboring cells.

7. The method of claim 6, further comprising inhibiting a cell when the check voltage threshold is higher than the final verify level.

8. The method of claim 6, wherein the at least one coupling effect includes a capacitive coupling coefficient, a diagonal-to-diagonal coupling effect, or a BL-to-BL coupling effect.

9. The method of claim 8, wherein the capacitive coupling coefficient is obtained as an average voltage threshold shift of cells on a first wordline divided by an average voltage threshold shift on a second wordline.

10. The method of claim 8, wherein the BL-to-BL coupling effect is obtained as an average voltage threshold shift of cells on a first half of bit lines divided by an average voltage threshold shift on a second half of bit lines.

11. A memory device, comprising:
a memory including a plurality of wordlines, each wordline including a plurality of cells; and
a controller configured to:
obtain an initial voltage threshold and a target state for each of the plurality of cells;
apply a pulse having a pulse value to each of the plurality of cells;
check a voltage threshold of each of the plurality of cells after applying the pulse in accordance with a permitted verify level and a final verify level, wherein the permitted verify level is less than the final verify level;
adjust the pulse value of a next pulse to be applied to a select cell of the plurality of cells in accordance with the checked voltage threshold, wherein the pulse value of the next pulse is incremented when the checked voltage threshold of the select cell is less than the permitted verify level, and the pulse value of the next pulse is decremented when the checked voltage threshold of the select cell is greater than the permitted verify level and less than the final verify level; and
calculate at least one coupling effect to neighboring cells after applying the pulse.

12. The memory device of claim 11, wherein the at least one coupling effect includes a capacitive coupling coefficient, a diagonal-to-diagonal coupling effect, or a BL-to-BL coupling effect.

13. The memory device of claim 12, wherein the capacitive coupling coefficient is obtained as an average voltage threshold shift of cells on a first wordline divided by an average voltage threshold shift on a second wordline.

14. The memory device of claim 12, wherein the BL-to-BL coupling effect is obtained as an average voltage threshold shift of cells on a first half of bit lines divided by an average voltage threshold shift on a second half of bit lines.

* * * * *